US006838751B2

(12) United States Patent
Cheng et al.

(10) Patent No.: US 6,838,751 B2
(45) Date of Patent: Jan. 4, 2005

(54) MULTI-ROW LEADFRAME

(75) Inventors: Man Hon Cheng, Hong Kong (HK); Wai Wong Chow, Hong Kong (HK); Fei Ying Wong, Hong Kong (HK)

(73) Assignee: Freescale Semiconductor Inc., Austin, TX (US)

(*) Notice: Subject to any disclaimer, the term of this patent is extended or adjusted under 35 U.S.C. 154(b) by 0 days.

(21) Appl. No.: 10/092,683

(22) Filed: Mar. 6, 2002

(65) Prior Publication Data

US 2003/0168719 A1 Sep. 11, 2003

(51) Int. Cl.[7] .................. H01L 23/495; H01L 21/66; H01L 21/00; H01L 21/48
(52) U.S. Cl. ..................... 257/666; 438/15; 438/64; 438/25; 438/111; 438/123
(58) Field of Search ................ 257/666, 672; 438/15, 64, 25, 111, 123

(56) References Cited

U.S. PATENT DOCUMENTS

| 4,809,135 A | 2/1989 | Yerman |
| 4,894,752 A | 1/1990 | Murata et al. |
| 5,157,480 A | 10/1992 | McShane et al. |
| 5,172,214 A | 12/1992 | Casto |
| 5,200,362 A | 4/1993 | Lin et al. |

FOREIGN PATENT DOCUMENTS

| JP | 55127047 | | 10/1980 |
| JP | 10-74859 | | 3/1989 |
| JP | 40227884 | * | 11/1990 |
| JP | 403116765 | * | 5/1991 |
| JP | 404093052 | * | 3/1992 |
| JP | 04123464 | | 4/1992 |
| JP | 5-21637 | | 1/1993 |
| JP | 05-36886 | * | 2/1993 |
| JP | 05-102384 | * | 4/1993 |
| JP | 5-343557 | | 12/1993 |
| JP | 6-244304 | | 9/1994 |
| JP | 8-236659 | | 9/1996 |
| JP | 8-279532 | | 10/1996 |
| JP | 11-233704 | | 8/1999 |
| JP | 2000286372 | | 10/2000 |

(List continued on next page.)

OTHER PUBLICATIONS

Van Nostrand Reinhold, "Microelectronic Packaging Handbook", 1989 p1152, ISBN 0–442–20578–3.*

Primary Examiner—Kamand Cuneo
Assistant Examiner—James M. Mitchell
(74) Attorney, Agent, or Firm—Charles E. Bergere

(57) ABSTRACT

A leadframe (20) for a semiconductor device includes a paddle ring (22) having an inner perimeter (24), an outer perimeter (26), and a cavity (28) located within the inner perimeter (24) for receiving an integrated circuit die (30). A first row of terminals (32) surrounds the outer perimeter (26) and a second row of terminals (34) surrounds the first row of terminals (32). Each of the terminals of the first row of terminals (32) is individually connected to the paddle ring (22) and each of the terminals of the second row of terminals (34) is connected to one side of a connection bar (78, 79), which is connected to one of the terminals of the first row (32) or to the paddle ring (22).

13 Claims, 4 Drawing Sheets

U.S. PATENT DOCUMENTS

| | | | | |
|---|---|---|---|---|
| 5,220,195 A | * | 6/1993 | McShane et al. | 257/666 |
| 5,262,674 A | | 11/1993 | Banerji et al. | |
| 5,399,904 A | * | 3/1995 | Kozono | 257/666 |
| 5,438,478 A | | 8/1995 | Kondo et al. | |
| 5,633,529 A | * | 5/1997 | Otsuki | 257/666 |
| 5,894,108 A | | 4/1999 | Mostafazadeh | |
| 5,942,794 A | | 8/1999 | Okumura et al. | |
| 5,963,050 A | * | 10/1999 | Young et al. | 326/41 |
| 5,969,411 A | * | 10/1999 | Fukaya | 257/666 |
| 5,973,388 A | | 10/1999 | Chew | |
| 6,005,286 A | * | 12/1999 | Kinsman | 257/666 |
| 6,133,623 A | * | 10/2000 | Otsuki et al. | 257/666 |
| 6,198,163 B1 | | 3/2001 | Crowley | |
| 6,229,200 B1 | * | 5/2001 | Mclellan et al. | 257/666 |
| 6,437,427 B1 | * | 8/2002 | Choi | 257/666 |
| 6,440,779 B1 | * | 8/2002 | Chiu et al. | 438/123 |
| 6,498,099 B1 | | 12/2002 | McLellan et al. | |
| 6,545,348 B1 | * | 4/2003 | Takano | 257/691 |
| 6,661,083 B2 | * | 12/2003 | Lee et al. | 257/676 |
| 2001/0008305 A1 | | 7/2001 | McLellan et al. | |
| 2001/0035569 A1 | | 11/2001 | Shibata | |
| 2001/0040286 A1 | * | 11/2001 | Fujimoto et al. | 257/692 |
| 2002/0024122 A1 | * | 2/2002 | Jung et al. | 257/666 |
| 2002/0140061 A1 | * | 10/2002 | Lee | 257/666 |
| 2002/0163015 A1 | * | 11/2002 | Lee et al. | 257/200 |
| 2003/0164554 A1 | * | 9/2003 | Fee et al. | 257/787 |

* cited by examiner

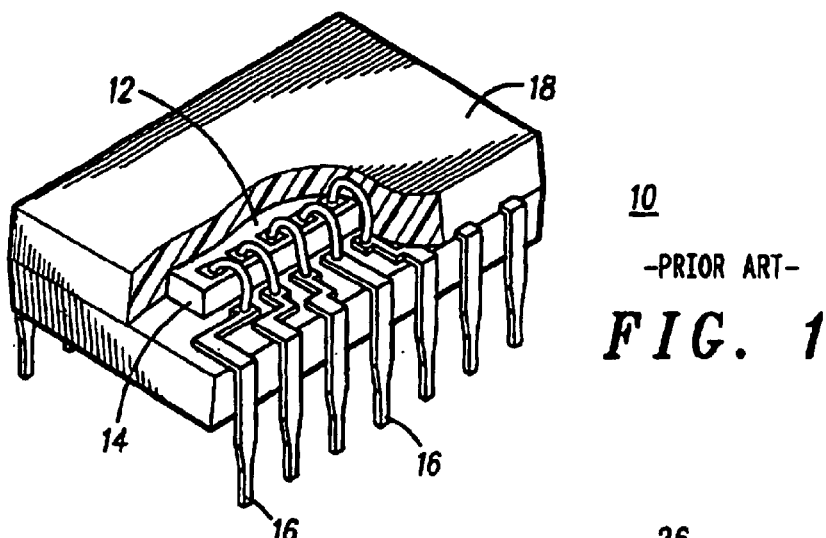
FIG. 1 —PRIOR ART—
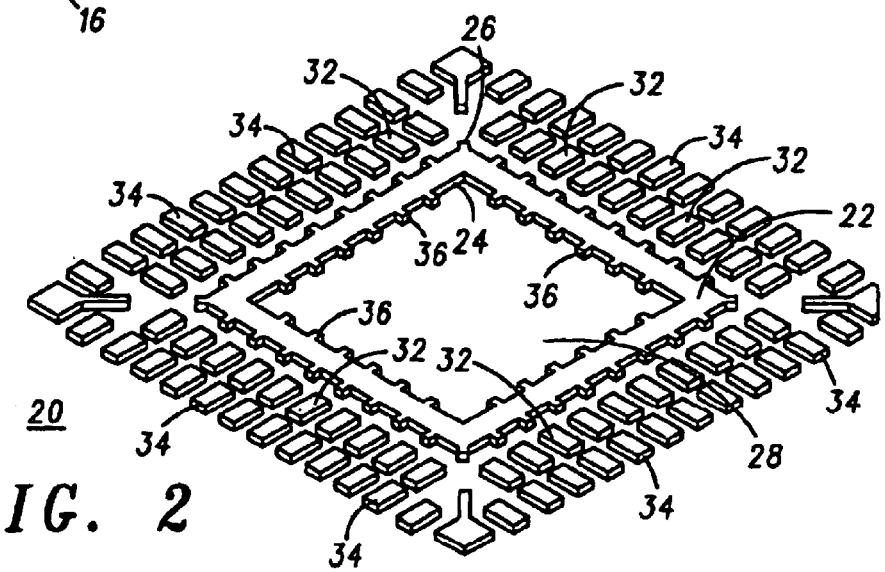
FIG. 2
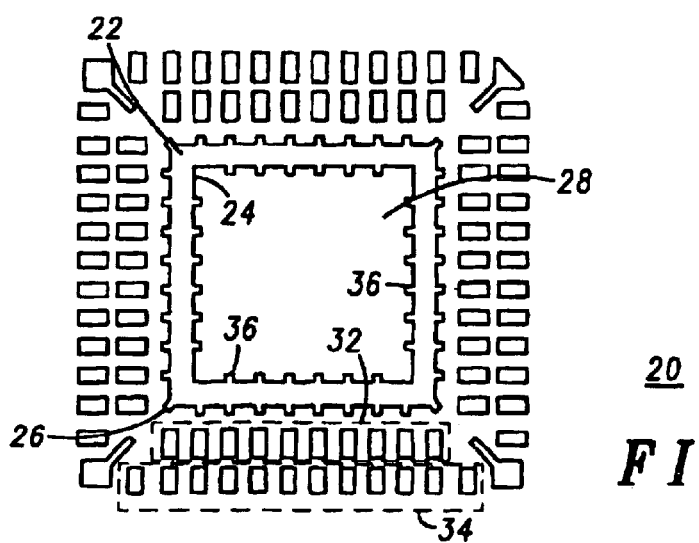
FIG. 3

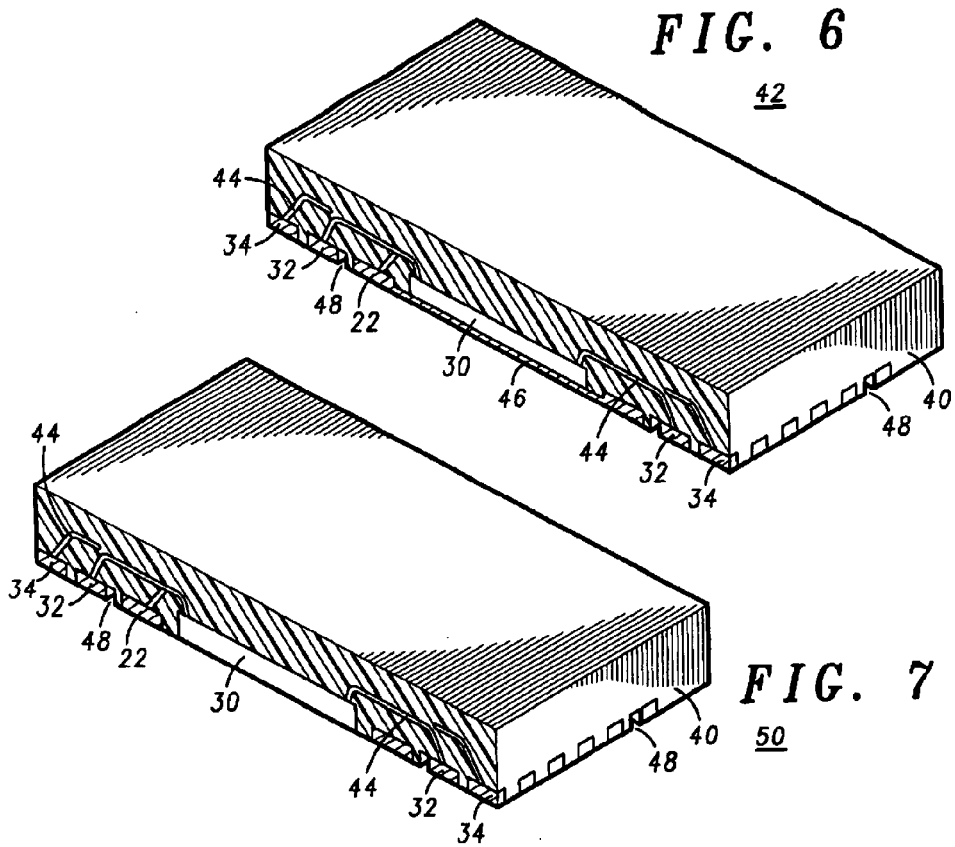
FIG. 6
FIG. 7
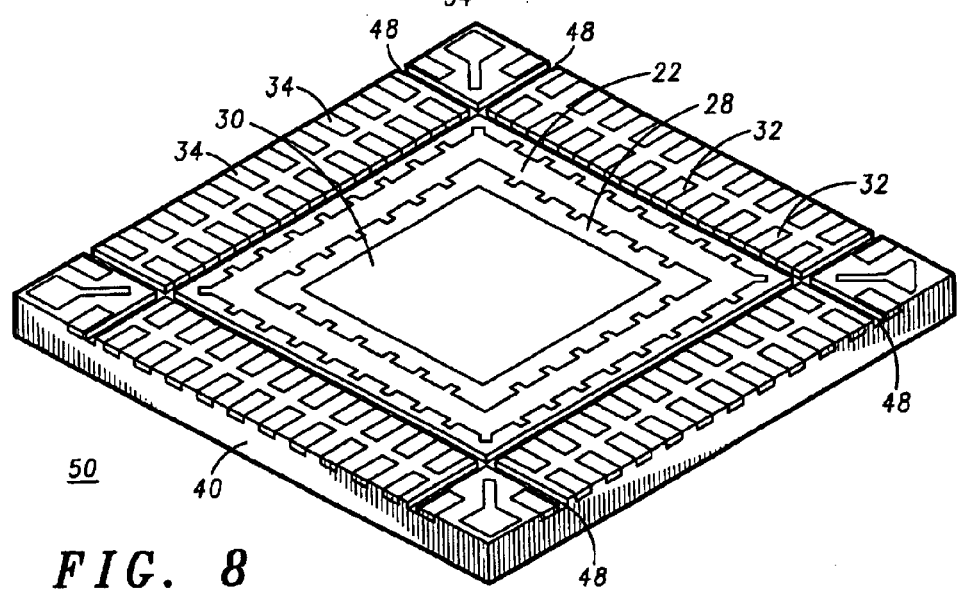
FIG. 8

MULTI-ROW LEADFRAME

BACKGROUND OF THE INVENTION

The present invention relates to integrated circuits and packaged integrated circuits and, more particularly, to a leadframe for packaged integrated circuits.

An integrated circuit (IC) die is a small device formed on a semiconductor wafer, such as a silicon wafer. Such a die is typically cut from the wafer and attached to a substrate or base carrier for interconnect redistribution. Bond pads on the die are then electrically connected to the leads on a carrier via wire bonding. The die and wire bonds are encapsulated with a protective material such that a package is formed. The leads encapsulated in the package are redistributed in a network of conductors within the carrier and end in an array of terminal points outside the package. Depending on the package type, these terminal points may be used as-is, such as in a Thin Small Outline Package (TSOP), or further processed, such as by attaching spherical solder balls for a Ball Grid Array (BGA). The terminal points allow the die to be electrically connected with other circuits, such as on a printed circuit board.

A leadframe is a metal frame, usually copper or nickel alloy, that supports the IC and provides external electrical connections for the packaged chip. A leadframe usually includes a die paddle and lead fingers.

Referring now to FIG. 1, an enlarged perspective view of a conventional packaged device 10 is shown. The device 10 includes an integrated circuit or die 12 attached to a die paddle 14 with an adhesive material (not shown). The die 12 is electrically connected to a plurality of lead fingers 16. More particularly, one end of each lead finger 16 is connected to a bond pad on the die 12 by wire bonds. The other end of each lead finger 16 is the lead, which allows the device 10 to be connected to a substrate or circuit board. The circuit 12, paddle 14, and part of the lead fingers 16 are encapsulated, such as with a molded plastic 18.

The number of input and output (I/O) pins of the packaged device 10 is limited by I/O pitch and package body size. However, as circuit density increases, it is desirable to provide more I/O pins, but in the same or smaller size package.

BRIEF DESCRIPTION OF THE DRAWINGS

The foregoing summary, as well as the following detailed description of preferred embodiments of the invention, will be better understood when read in conjunction with the appended drawings. For the purpose of illustrating the invention, there is shown in the drawings embodiments that are presently preferred. It should be understood, however, that the invention is not limited to the precise arrangements and instrumentalities shown. In the drawings:

FIG. 1 is an enlarged perspective view of a conventional packaged semiconductor device;

FIG. 2 is an enlarged perspective view of a leadframe in accordance with a first embodiment of the present invention;

FIG. 3 is an enlarged top plan view of the leadframe of FIG. 2;

FIG. 6 is an enlarged, isometric cross-sectional view taken along line 6—6 of the packaged semiconductor device of FIG. 4;

FIG. 7 is an enlarged, isometric cross-sectional view of a packaged semiconductor device in accordance with a second embodiment of the present invention;

FIG. 8 is an enlarged perspective view of a bottom side of the packaged semiconductor device of FIG. 7;

DETAILED DESCRIPTION OF PREFERRED EMBODIMENTS

Figure 4:
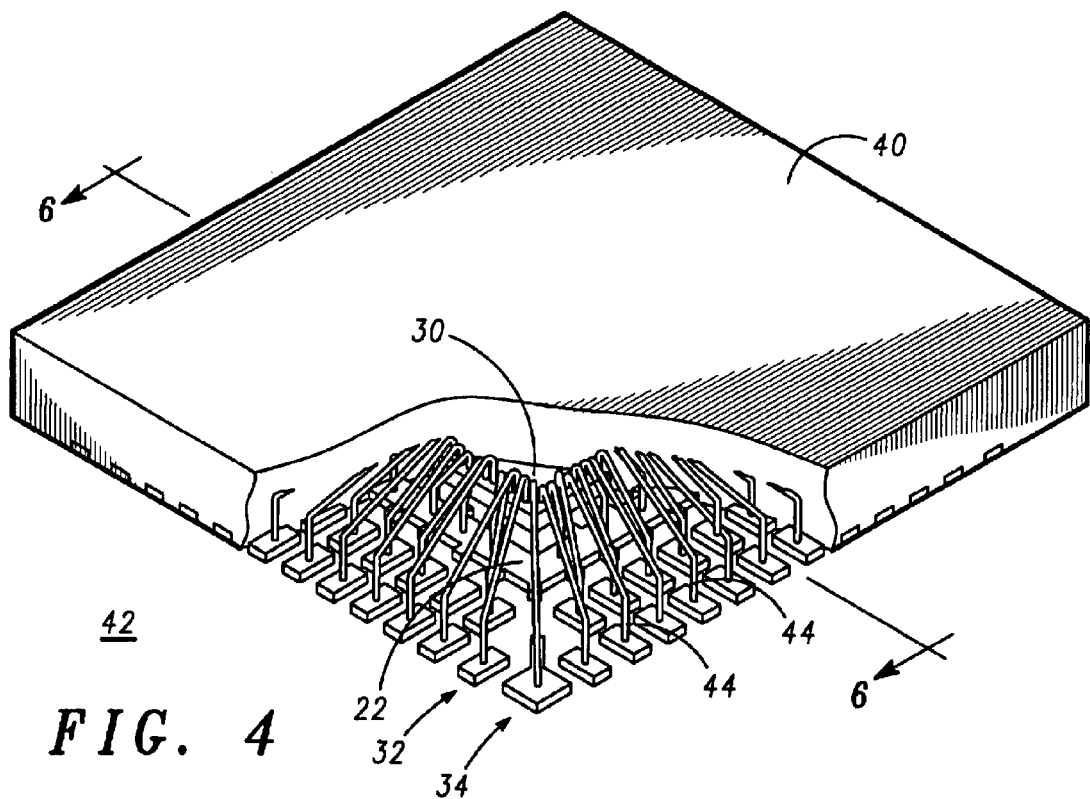
FIG. 4 is an enlarged perspective view of a packaged semiconductor device including the leadframe of FIG. 2.

The detailed description set forth below in connection with the appended drawings is intended as a description of the presently preferred embodiments of the invention, and is not intended to represent the only forms in which the present invention may be practiced. It is to be understood that the same or equivalent functions may be accomplished by different embodiments that are intended to be encompassed within the spirit and scope of the invention. As will be understood by those of skill in the art, the present invention can be applied to various packages and package types.

Certain features in the drawings have been enlarged for ease of illustration and the drawings and the elements thereof are not necessarily in proper proportion. Further, the invention is shown embodied in a quad flat no-lead (QFN) type package. However, those of ordinary skill in the art will readily understand the details of the invention and that the invention is applicable to other package types. In the drawings, like numerals are used to indicate like elements throughout.

In order to provide an integrated circuit device with increased I/O pins, the present invention is a leadframe for a semiconductor device. The leadframe includes a paddle ring having an inner perimeter, an outer perimeter, and a cavity located within the inner perimeter for receiving an integrated circuit die. A first row of terminals generally surrounds the paddle ring outer perimter and a second row of terminals surrounds the first row of terminals. Thus, the leadframe has multiple rows of terminals.

The present invention also provides a novel semiconductor device including a paddle ring having an inner perimeter, an outer perimeter, and a cavity located within the inner perimeter. A first row of terminals generally surrounds the paddle ring outer perimeter and a second row of terminals surrounds the first row of terminals. An integrated circuit die is located within the cavity and surrounded by the paddle ring. The die includes a plurality of die pads that are electrically connected to respective ones of the terminals of the first and second rows of terminals.

The present invention further comprises a method of packaging a semiconductor device comprising the steps of:
   forming a leadframe having a paddle ring including an inner perimeter, an outer perimeter and a cavity located within the inner perimeter, a first row of terminals surrounding the paddle ring and individually connected thereto, and a second row of terminals surrounding the first row of terminals, wherein the terminals of the second row of terminals are connected to a connection bar and the connection bar is connected to at least one of the terminals of the first row of terminals or the paddle ring;
   placing an integrated circuit die within the cavity;

electrically connecting die pads of the integrated circuit die to the terminals of the first and second rows of terminals;

performing a first singulation operation that separates the terminals of the first row from the paddle ring; and performing a second singulation operation that separates the terminals of the second row from the connection bar and separates the connection bar from the connected one of the at least one of the terminals of the first row of terminals and the paddle ring.

Referring now to FIGS. 2 and 3, a leadframe 20 in accordance with the present invention is shown. The leadframe 20 includes a paddle ring 22 having an inner perimeter 24, an outer perimeter 26, and a cavity 28 located within the inner perimeter 24. The cavity 28 is sized and shaped for receiving an integrated circuit die 30 (FIG. 4). The paddle ring 22 is generally square shaped, although it could have other shapes depending on the shape of the integrated circuit die 30. The integrated circuit die 30 may be of a type known to those of skill in the art, such as a circuit formed on and cut from a silicon wafer. The cavity 28 of the paddle ring 22 is sized and shaped to receive the die 30. Typical die sizes may range from 4 mm×4 mm to 12 mm×12 mm. The die 30 may have a thickness ranging from about 6 mils to about 21 mils.

The leadframe 20 also includes a first row of terminals 32 generally surrounding the outer perimeter 26 of the paddle ring 22 and a second row of terminals 34 surrounding the first row of terminals 32. In FIG. 3, portions of the first and second rows of terminals 32, 34 enclosed with dashed lines. As discussed in more detail below, FIGS. 2 and 3 show the first and second rows of terminals 32, 34 after they have been separated from the paddle ring 22.

In the presently preferred embodiment, the inner perimeter 24 of the paddle ring 22 includes a plurality of first spaced projections 36 that extend from the paddle ring 22 inwardly. Similarly, the outer perimeter 26 of the paddle ring 22 includes a plurality of second spaced projections 38 that extend outwardly or towards the first and second rows of terminals 32, 34. The spaced projections 36, 38 increase the mechanical locking between the leadframe 20 and molding compound 40 (FIG. 4). However, it is not a requirement that the paddle ring 22 have either or both of the spaced projections 36, 38, and in some designs, the paddle ring 22 may have only one of the spaced projections 36, 38.

Referring now to FIG. 4, a chip scale package (CSP) type plastic IC package 42 is shown. The package 42 includes the paddle ring 22, the IC die 30, the first and second rows of terminals 32, 34, mold compound 40, and bond wires 44. The paddle ring 22 includes the first and second spaced projections to enhance securing the die and leadframe to the mold compound 40. In this example, the paddle ring 22 is used as a ground and the first and second rows of terminals 32, 34 are used for power and signal I/O. Thus, as shown in the drawings, some of the die pads are wirebonded to the paddle member 22, and the remaining die pads are wirebonded to the first and second rows of terminals 32, 34. By providing two rows of terminals, the package 42 achieves a higher I/O density than similar prior art packages.

Figure 5:
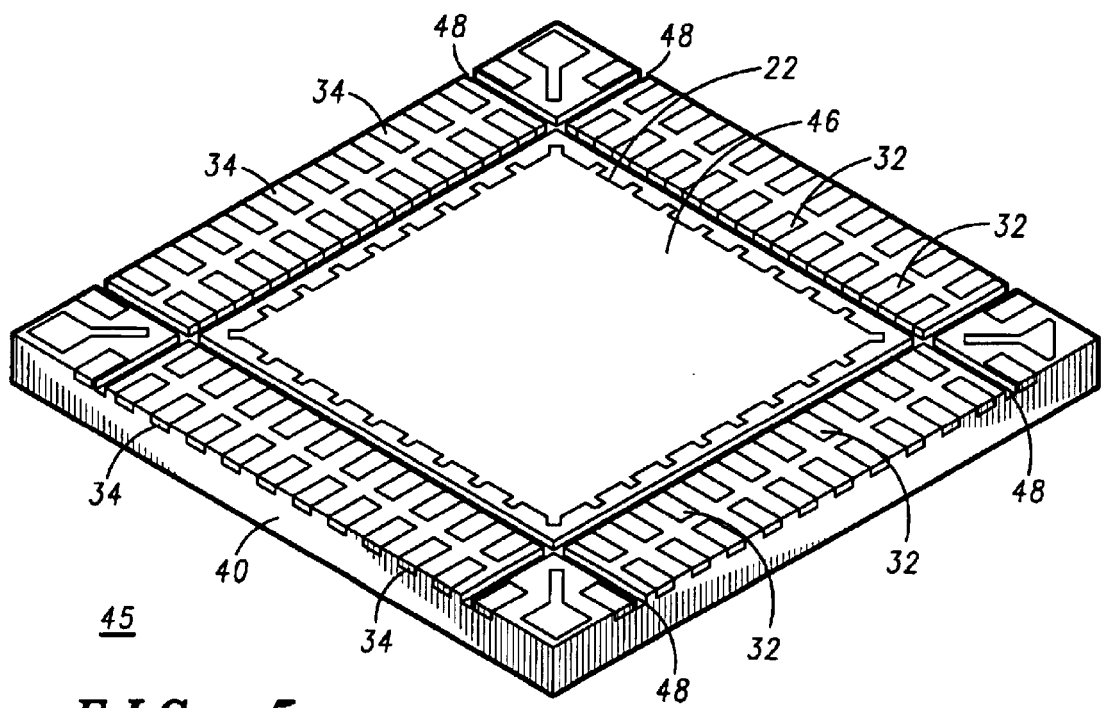
FIG. 5 is an enlarged perspective view of a bottom side of a packaged semiconductor device in accordance with an embodiment of the present invention.

Referring now to FIG. 5, a bottom perspective view of an embodiment of a QFN package 45 is shown. The package 45 has two rows of terminals 32, 34, the paddle member 22 and the mold compound 40. In this embodiment, the paddle member 22 includes a flag member 46 located within the cavity 28. The IC die 30 is attached to the flag member 46 in a known manner, such as with an adhesive material layer or an adhesive tape. The flag member 46 may be at the same height or planar with the paddle ring 22 or, as shown in the drawing, the flag member may be stepped down or recessed. It is noted that in this embodiment, the paddle ring 22 of the package 45 only has spaced projections that project inwardly, and does not include outward spaced projections. However, as discussed above, the package 45 could be designed to have just outward spaced projections, both outward and inward spaced projections, or no projections at all.

Referring now to FIG. 6, which is side cross-sectional view of the package 42 of FIG. 4, the flag member 46 is more readily visible. As can be seen, the flag member 46 is integral with the paddle ring 22. It is also preferred that all of the terminals in the first and second rows of terminals 32, 34 are exposed on at least one side, for example, for solder fillet forming. The terminals in the second row of terminals 34 are exposed at the outer edge of the package 42. In order to expose the terminals of the first row of terminals 32, a groove or channel 48 is formed in the package 42 between the paddle member 22 and the first row of terminals 32. The groove 48 preferably is formed by a singulation process. That is, the groove 48 is formed by a depth controlled cut with a saw, such as a saw used for cutting dice from a wafer. The singulation separates the first row of terminals 32 from the paddle ring 22 and exposes one vertical side of the first row of terminals 32 for solder fillet formation.

As can be seen in FIG. 6, the package 42 is an exposed paddle type package. In exposed paddle (EP) type packages, at least one side of a metal die pad (i.e., the flag member 46) is exposed.

Referring now to FIGS. 7 and 8, a chip scale package (CSP) type IC package 50 in accordance with a second embodiment of the present invention is shown. The package 50 includes the paddle member 22, the IC die 30, the first and second rows of terminals 32, 34, mold compound 40, and bond wires 44. The paddle member 22 includes the first and second spaced projections to enhance securing the die and leadframe to the mold compound 40. However, as can be seen in FIG. 7, the package 50 does not include a flag member, but only the paddle ring 22.

Figure 9:
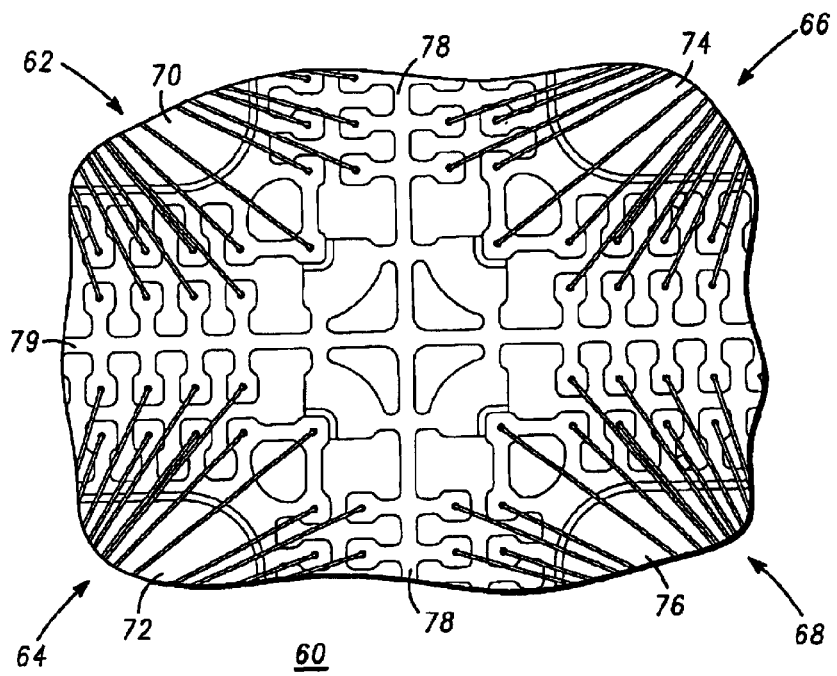
FIG. 9 is an enlarged top plan view of parts of four semiconductor devices connected to a leadframe panel of the present invention prior to singulation.

Referring now to FIG. 9, a top plan view of a portion of a leadframe panel 60 in accordance with the present invention is shown. More particularly, FIG. 9 shows the intersection of four separate leadframes 62–68 electrically connected to respective die 70–76 with wirebonds, prior to the leadframes and die being separated and packaged. The leadframes 62–68 are interconnected with unit-to-unit connection bars 78 and 79, and the individual terminals of the second row of terminals extend in opposite directions from the connection bars 78 and 79. That is, each of the terminals of the second row of terminals for one of the leadframes is connected to one side of a connection bar 78, 79. Then, the connection bars 78, 79 are connected to either one of the terminals of the first row of terminals or a corner of a leadframe.

Figure 10:
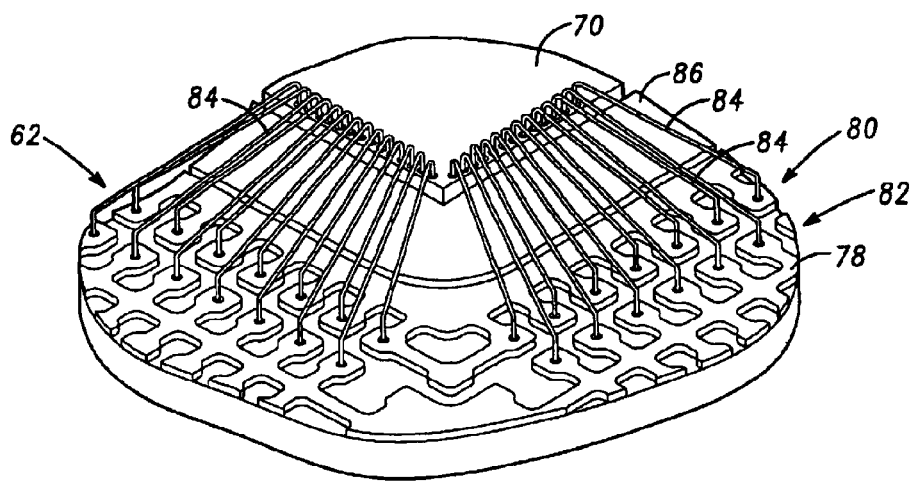
FIG. 10 is an enlarged perspective view of one of the semiconductor devices of FIG. 9 connected to a leadframe of the leadframe panel of FIG. 9.

For example, FIG. 10 is an enlarged perspective view of the leadframe 62 and the die 70. The leadframe 62 has a first row of terminals 80 and a second row of terminals 82. Each of the rows of terminals 80, 82 is connected to pads on the die 70 with wires 84. The leadframe 62 also includes a paddle ring 86. Prior to singulation, the terminals of the first row of terminals 80 are individually connected to the paddle ring 86. On the other hand, each of the terminals of the second row of terminals 82 is connected to one of the connection bars. For instance, the terminals of the second row of terminals on one side of the die 70 are connected to the connection bar 78.

Referring again to FIG. 9, the connection bars 78 and 79 intersect at a point between the four die 70–76. The first (inner) rows of terminals are attached to the connection bars 78, 79 through grooved connection interfaces 77 in a manner such as that shown in the drawing. The lead frame panel 60 is preferably formed from a sheet of conductive metal having a good thermal conductivity, such as copper. The leadframe panel 60 may be formed by a stamping method, however, for more complex and higher density leadframes, a chemical etching method is preferred. As is understood by those of skill in the art, the etching method uses an artwork mask to define the detailed pattern of the leadframe and then the unmasked portion of the metal is etched away. A plating mask is used to mask out no-plating zones, if any, and then the unmasked portions are plated with metal layers with a plating process. Rinsing and cleaning steps are performed between processes. Such masking, etching, plating, rinsing and cleaning processes are well known to those of skill in the art.

In order to form separate devices, it is preferred to use two saw singulation operations, such as are used to separate dice from a wafer. A first singulation operation in which the depth of the cut is controlled is performed to separate the terminals of the first row from the paddle ring. Then, a second singulation operation is performed to separate the terminals of the second row from the connection bars, which also separates the neighboring devices from each other. The second singulation operation also separates the connection bar from the terminals of the first row of terminals near the intersection of the two connection bars.

To briefly summarize one method of forming a packaged device, a die 30 is placed in the cavity 28 and on a flag member 46 if the leadframe includes a flag member 46. Next, the die 30 is electrically connected to the leadframe terminals 32, 34 using a wirebonding process. Then, a mold compound 40 is formed over the die 30 and leadframe. Finally, singulation operations are performed to separate and expose the leadframe terminals 32, 34.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. For example, a leadframe having more than two rows of terminals could be formed. In addition, the die and paddle sizes may vary to accommodate the required package design. Further, although the leadframe panel shown in FIG. 9 has the first (inner) row of terminals each individually connected to the paddle ring and the second (outer) row of terminals connected to a connection bar, other ways of making a leadframe having rows of terminals can be made, such as having both the first and second rows of terminals connected to a connection bar and then to the paddle ring only at the corners of the paddle ring. It is understood, therefore, that this invention is not limited to the particular embodiments disclosed, but covers modifications within the spirit and scope of the present invention as defined by the appended claims.

What is claimed is:

1. A leadframe for a semiconductor device, the leadframe comprising:
   a paddle ring having an inner perimeter, an outer perimeter, and a cavity located within the inner perimeter for receiving an integrated circuit die, wherein the inner perimeter of the paddle ring also includes a plurality of spaced projections;
   a first row of terminals integral with, extending outwardly from, and generally surrounding the paddle ring, wherein the terminals of the first row of terminals are sized and shaped such that wires may be wirebonded between the terminals and bonding pads of an integrated circuit die disposed within the cavity and the terminals may be cut and thus separated from the paddle ring without destroying the wirebond;
   a second row of terminals aligned with, surrounding and spaced from the first row of terminals; and
   a connection bar surrounding the first and second rows of terminals, wherein each of the terminals of the second row of terminals is connected to the connection bar and wherein the first row of terminals is connected to the second row of terminals at a corner of the connection bar.

2. The leadframe of claim 1, wherein the outer perimeter of the paddle ring includes a plurality of spaced projections.

3. The leadframe of claim 1, further comprising a paddle flag member located within the cavity that supports the integrated circuit die.

4. The leadframe of claim 3, wherein the flag member is integral with the paddle ring.

5. The leadframe of claim 1, wherein the paddle ring is generally square shaped and the connection bar is connected to at least one of the terminals of the first row of terminals or the paddle ring at a corner thereof.

6. The leadframe of claim 5, further comprising another row of terminals is connected to a first side of the connection bar opposing a second side of the connection bar to which the seond row of terminals is connected, said another row of terminals for connecting to a second integrated circuit die.

7. The leadframe of claim 1, wherein the leadframe is formed of copper.

8. The leadframe of claim 7, wherein the leadframe is formed via an etching process.

9. A semiconductor device, comprising:
   a paddle ring having an inner perimeter, an outer perimeter, and a cavity located within the inner perimeter, wherein the inner perimeter of the paddle ring also includes a plurality of spaced projections;
   a first row of terminals integral with, extending outwardly from and generally surrounding the paddle ring, wherein each of the terminals of the first row of terminals is sized and shaped such that a wire may be wirebonded between the terminal and a bonding pad of an integrated circuit die disposed within the cavity and the terminal may be cut and thus separated from the paddle ring;
   a second row of terminals aligned with, surrounding, and spaced from the first row of terminals;
   a connection bar surrounding the first and second rows of terminals, wherein each of the terminals of the second row of terminals is connected to the connection bar and wherein the first row of terminals is connected to the second row of terminals at a corner of the connection bar;
   an integrated circuit die placed within the cavity and surrounded by the paddle ring, the die including a plurality of die pads; and
   a plurality of wires electrically connected to respective ones of the terminals of the first and second rows of terminals and the die pads.

10. The semiconductor device of claim 9, further comprising:
   a flag member located within the cavity that supports the integrated circuit die; and an adhesive material layer disposed on a top surface of the flag member for securing the die to the flag member.

11. The semiconductor device of claim 10, wherein the flag member is integral with the paddle ring.

12. The semiconductor device of claim 9, further comprising an encapsulant covering a top surface of the integrated circuit die, the first and second rows of terminals, and the paddle ring, wherein at least a bottom surface of the first and second rows of terminals is exposed.

13. The semiconductor device of claim 9, wherein the outer perimeter of the paddle ring also includes a plurality of spaced projections.

* * * * *